United States Patent
Bedeschi

(10) Patent No.: US 9,171,614 B2
(45) Date of Patent: *Oct. 27, 2015

(54) RELIABLE SET OPERATION FOR PHASE-CHANGE MEMORY CELL

(71) Applicant: Micron Technology, Inc., Boise, ID (US)

(72) Inventor: Ferdinando Bedeschi, Biassono (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 74 days.

This patent is subject to a terminal disclaimer.

(21) Appl. No.: 14/100,252

(22) Filed: Dec. 9, 2013

(65) Prior Publication Data

US 2014/0098603 A1    Apr. 10, 2014

Related U.S. Application Data

(63) Continuation of application No. 13/903,261, filed on May 28, 2013, now Pat. No. 8,605,498, which is a continuation of application No. 12/623,299, filed on Nov. 20, 2009, now Pat. No. 8,456,886.

(30) Foreign Application Priority Data

Dec. 31, 2008    (WO) .................. PCT/IT2008/000823

(51) Int. Cl.
*G11C 13/00*    (2006.01)
*G11C 11/56*    (2006.01)

(52) U.S. Cl.
CPC ............ *G11C 13/0009* (2013.01); *G11C 11/56* (2013.01); *G11C 11/5678* (2013.01);
(Continued)

(58) Field of Classification Search
CPC ....................................................... G11C 13/00
USPC ......................................................... 365/148
See application file for complete search history.

(56) References Cited

U.S. PATENT DOCUMENTS 6,570,784 B2    5/2003    Lowrey et al.
7,522,449 B2    4/2009    Ro et al.
(Continued)

FOREIGN PATENT DOCUMENTS

EP    1883113    1/2008

OTHER PUBLICATIONS

International Search Report mailed Apr. 28, 2009 in corresponding International Application No. PCT/IT2008/000823.
(Continued)

*Primary Examiner* — Min Huang
(74) *Attorney, Agent, or Firm* — Knobbe, Martens, Olson & Bear LLP

(57) ABSTRACT

A Phase-Change Memory (PCM) device and a method of writing data to the PCM device are described. The PCM device includes a multi-phase data storage cell having at least a Set state and a Reset state that may be established using a heater configured to heat the data storage cell. A memory interface may be coupled with the heater configured to write data to the data storage cell, the data being represented by the Set or the Reset states. A write Reset pulse is used to place the data storage cell in the Reset state corresponding to a read value that is less than a read threshold. A write Set pulse that is a predetermined function of the write Reset pulse is used to place the data storage cell in the Set state. The PCM device may include additional intermediate states that enable each data storage cell to store two or more bits of information. Other embodiments may be described and claimed.

20 Claims, 6 Drawing Sheets

(52) U.S. Cl.
CPC ........ *G11C13/0004* (2013.01); *G11C 13/0064* (2013.01); *G11C 13/0069* (2013.01); *G11C 2013/0092* (2013.01)

(56) References Cited

U.S. PATENT DOCUMENTS

| | | | |
|---|---|---|---|
| 7,646,632 B2 | 1/2010 | Philipp et al. | |
| 7,830,705 B2 | 11/2010 | Jeong | |
| 7,894,237 B2 * | 2/2011 | Karpov et al. | 365/148 |
| 7,907,436 B2 | 3/2011 | Maejima et al. | |
| 8,456,886 B2 * | 6/2013 | Bedeschi | 365/148 |
| 8,605,498 B2 * | 12/2013 | Bedeschi | 365/163 |
| 2009/0016100 A1 * | 1/2009 | Jeong | 365/163 |
| 2009/0161415 A1 * | 6/2009 | Philipp et al. | 365/163 |
| 2009/0207647 A1 * | 8/2009 | Maejima et al. | 365/148 |

OTHER PUBLICATIONS

Written Opinion mailed Apr. 28, 2009 in corresponding International Application No. PCT/IT2008/000823.

* cited by examiner

RELIABLE SET OPERATION FOR PHASE-CHANGE MEMORY CELL

CROSS-REFERENCE TO RELATED APPLICATIONS

This application is a continuation of U.S. application Ser. No. 13/903,261, filed May 28, 2013, titled RELIABLE SET OPERATION FOR PHASE-CHANGE MEMORY CELL, which is a continuation of U.S. application Ser. No. 12/623, 299, filed Nov. 20, 2009, now U.S. Pat. No. 8,456,886 titled RELIABLE SET OPERATION FOR PHASE-CHANGE MEMORY CELL, which claims priority to International Application No. PCT/IT2008/000823, filed Dec. 31, 2008, titled RELIABLE SET OPERATION FOR PHASE-CHANGE MEMORY CELL, the entire contents of each of which are incorporated by reference herein and made a part of this specification.

TECHNICAL FIELD

The present disclosure is generally directed to computer memory and more particularly to the Set operation for Phase-Change Memory (PCM).

BACKGROUND

Memory is an integral part of any computing device for storing and retrieving information. Computer memory may be classified on different basis, such as amount of data (for example, mass storage versus cache memory), access (for example, random access memory versus read-only memory), technology (for example, magnetic versus optical), performance (for example, archival versus execution memory), and the like. With the ubiquity of computers and communication networks for personal and business use, the need for data storage has increased exponentially in recent years. This need is especially increased due to the abundance and constant production of multimedia data such as music, video clips, and pictures. Commensurate with increased use of memory is the increased need for reliability of storage medium and storage of data in absence of power. Relatively recent technologies used for solid-state storage of data, especially for mobile devices, include flash memories and phase-change memories (PCM) that retain stored information in absence of power. Set pulse, used to write a data bit to a PCM cell, may vary significantly from cell to cell in a memory array, potentially causing subsequent read errors resulting in data reliability problems.

BRIEF DESCRIPTION OF THE DRAWINGS

Non-limiting embodiments of the present disclosure are described with reference to the following drawings. For a better understanding of the present disclosure, the detailed description that follows is to be read in association with the accompanying drawings referenced therein, wherein.

DETAILED DESCRIPTIONS

Figure 1:
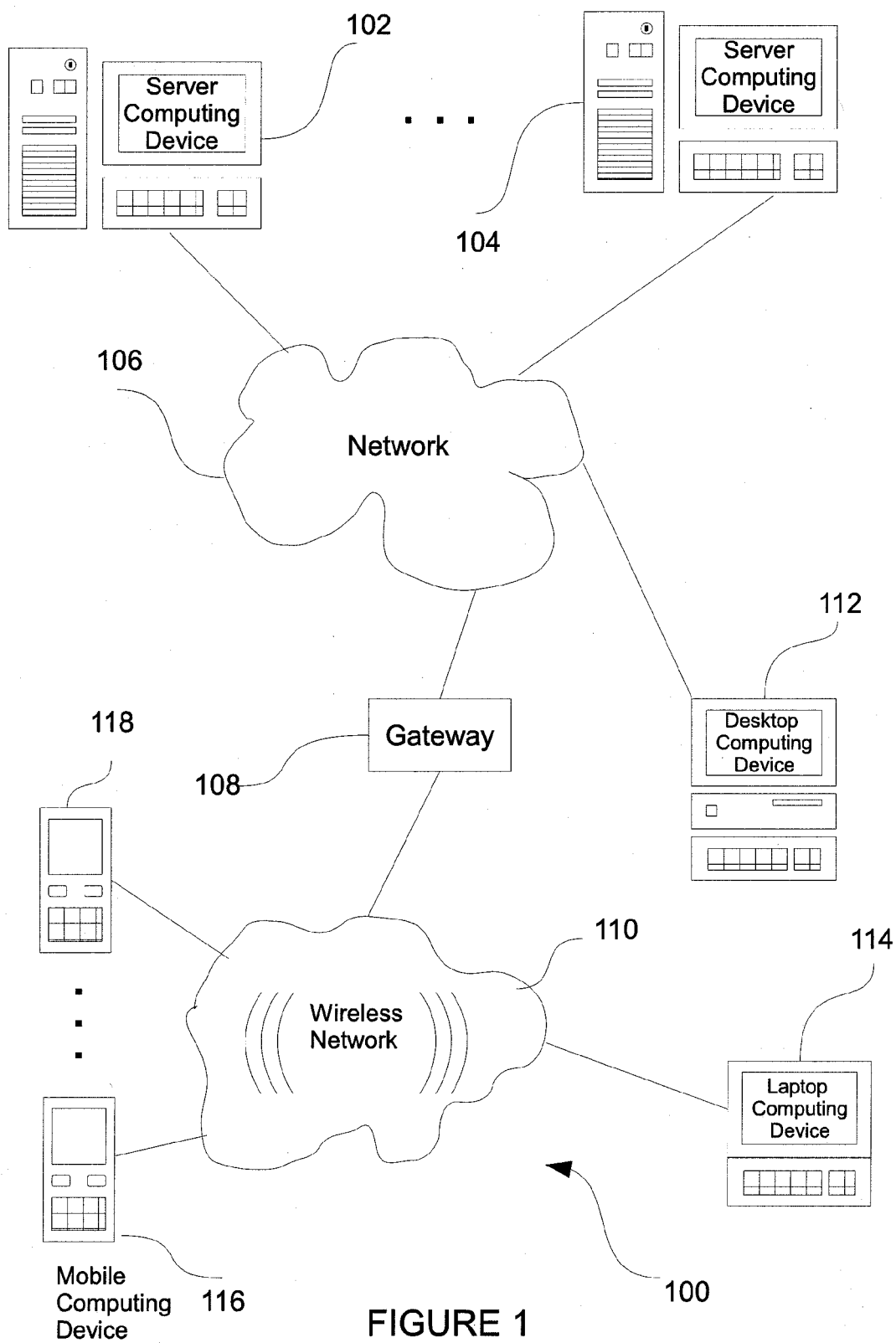
FIG. 1 shows an embodiment of a network computing environment wherein the disclosure may be practiced.

The present disclosure will now be described more fully hereinafter with reference to the accompanying drawings, which form a part hereof, and which show, by way of illustration, specific embodiments of the present disclosure. This disclosure may be embodied in many different forms and should not be construed as limited to the embodiments set forth herein. Rather, these embodiments are provided so that this disclosure is thorough and complete, and may fully convey the scope of the disclosure to those of ordinary skill in the art. Among other things, the present disclosure may be embodied as methods or devices. Accordingly, the present disclosure may be in the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrases "in one embodiment," "in an illustrative embodiment," and the like, as used herein do not necessarily refer to the same embodiment, though they may. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" may include "in" and "on," unless otherwise stated.

The term "memory array" as used herein, may represent a logical grid (which may or may not correspond to a physical grid) of memory components that are addressable by two address components, such as a row value and a column value. Additionally, the term memory array may refer to a multi-dimensional or N-dimensional array, addressable by N independent address components, such as 3-dimensional arrays or banks of 2- or 3-dimensional arrays.

The terms "crystal," "crystalline," "crystallization," and the like, as used herein, indicate a self-organized state of solid matter where molecules are spontaneously arranged in a repeating pattern of geometric lattices, like sugar, salt, quartz, and diamond molecules.

The term "cell" or "memory cell," as used herein, may denote a storage component of the memory array where actual data are recorded and represented. The memory cell may be multi-phase or include multiple states, such as "Set," "Reset," and one or more intermediate states, where each such state may represent at least a portion of a data value stored in the memory array.

The terms "Set" and "Reset," as used herein, represent a logical/Boolean value, such as a logic-1, and logic-0, respectively. Those skilled in the art will appreciate that representation of logic-1 and logic-0 values are arbitrary and such representations may be freely chosen as one symbol or another, as long as such representation is applied consistently throughout a system and/or process. For example, a "high" signal level or a signal transition from low-to-high may be chosen to represent logic-0 or logic-1. In the present disclosure, for illustrative purposes, the "Set" state of the memory cell is used to represent logic-1, while "Reset" state is used to represent logic-0. The term "intermediate state" and the like, as used herein, may denote a semi-crystalline and/or a semi-amorphous state of the memory cell.

The term "chalcogenide glass," as used herein, may denote the material used in construction of a memory cell. Chalcogenide glass may have two or more states, such as the crystalline and amorphous states, which have different electrical resistivity. The different electrical resistivity may form the basis by which data are stored. For example, the amorphous, high resistance state may be used to represent a binary/logic 0, and the crystalline, low resistance state may be used to represent a binary/logic 1. Additionally, the chalcogenide glass may include one or more intermediate states, such as semi-crystalline and/or semi-amorphous states, distinct from the crystalline and amorphous states. Such intermediate states, along with the Set and the Reset states, may be used to represent a tri-nary (3 values per bit), quad-nary (4 values per bit), or N-nary (N values per bit) numbers that increase capacity of per-bit storage of information compared with binary (2 values per bit) numbers.

The terms "Set pulse" and "Reset pulse," as used herein, may represent a voltage pulse or a current pulse needed to activate a heater component to heat the memory cell material, for example, the chalcogenide glass, into different states, such as the crystalline and/or the amorphous state.

The term "sweep," "Set sweep," "sweep down," "sweep up," "blind Set sweep," and the like, as used herein, may denote a process of gradually and continually increasing or decreasing a continuous Set and/or Reset pulse and/or a corresponding temperature to place the memory cell in a Set, Reset, or an intermediate state. The term "Set staircase up," "Set staircase down," "staircase up/down," and the like, as used herein, may denote a process of increasing or decreasing a discrete current pulse to place the memory cell in a target state, such as a Set, Reset, or intermediate state. The term "recovery set sweep ramp," as used herein, may denote a substantially maximum Set pulse initial value used for sweeping down to a Set pulse level that successfully places the memory cell in a crystalline or semi-crystalline (when intermediate states are defined/used) state.

The following briefly describes illustrative embodiments of the disclosure to provide a basic understanding of some aspects of the disclosure. This brief description is not intended as an extensive overview. It is not intended to identify key or critical elements, or to delineate or otherwise narrow the scope. Its purpose is merely to present some concepts in a simplified form as a prelude to the more detailed description that is presented later.

Briefly described, in one aspect of the present disclosure a PCM device includes a multi-phase data storage cell having at least a Set state and a Reset state that may be established using a heater configured to heat the data storage cell. A memory interface may be coupled with the heater configured to write data to the data storage cell, the data being represented by the Set or the Reset states. A write Reset pulse is used to place the data storage cell in the Reset state corresponding to a read current that is lower than a read current threshold. A write Set pulse based on the write Reset pulse is used to place the data storage cell in the Set state corresponding to a read current greater than the read current threshold.

While some embodiments discuss comparing a read current to a read current threshold to determine whether a cell is in a Set or a Reset state, it will be understood that other embodiments may compare other read values to other read thresholds. For example, in one embodiment, a read voltage could be compared against a read voltage threshold, once a given current is forced into the cell. In this case, it may be that a Reset state is detected by having a cell voltage GREATER than a read reference threshold and vice versa.

In another aspect of the present disclosure a method of writing data to a PCM device is described. The method includes applying a write Reset pulse to place a data storage cell in a Reset state representing data to be written to the PCM. The Reset state corresponds to a read current lower than a predetermined read current threshold. The method further includes using a write Set pulse based on the write Reset pulse to place the data storage cell in a Set state.

In yet another aspect of the present disclosure a PCM device is described including a multi-phase data storage cell having at least a Set state, a Reset state, and a first intermediate state. Each of these states may represent a portion of a data to be written to the PCM device. The PCM device further includes a heating component configured to establish one of the states of the data storage cell. The heating component is coupled with a memory interface configured to write the data to the data storage cell. A write Reset pulse is used to place the data storage cell in the Reset state corresponding to a read current less than a predetermined read current threshold. A write Set pulse equal to a proportion of the write Reset pulse is used to place the data storage cell in the Set state. An intermediate write current equal to another proportion of the write Reset pulse is used to place the data storage cell in the first intermediate state.

In yet another aspect of the present disclosure a memory array is described including a number of multi-phase data storage cells, some of which have at least a Set state and a Reset state. The memory array may further include a heater configured to heat the data storage cell. A memory interface coupled with the heater is configured to write data to the data storage cells, the data being represented by one of the Set or the Reset. A write Reset pulse is used to place the data storage cell in the Reset state corresponding to a read current less than a predetermined read current threshold. A write Set pulse substantially equal to a proportion of the write Reset pulse is used to place the data storage cell in the Set state.

In still another aspect of the present disclosure an apparatus is disclosed including a processor, and a plurality of multi-phase data storage cells coupled with the processor. Some of the plurality of the multi-phase data storage cells have at least a Set state and a Reset state. These storage cells may further include a heater configured to heat the data storage cell, and a memory interface used to write data to the data storage cells, the data being represented by one of the Set or the Reset. A write Reset pulse is used to place the data storage cell in the Reset state corresponding to a read current less than a read current threshold. A write Set pulse equal to a proportion of the write Reset pulse is used to place the data storage cell in the Set state.

Illustrative Operating Environment

FIG. 1 shows components of an illustrative environment in which the disclosure may be practiced. Not all the shown components may be required to practice the disclosure, and variations in the arrangement and type of the components may be made without departing from the spirit or scope of the disclosure. System 100 may include Local Area Networks (LAN) and Wide Area Networks (WAN) shown collectively as Network 106; wireless network 110; gateway 108 configured to connect remote and/or different types of networks together; client computing devices 112-118; and server computing devices 102-104.

One embodiment of a computing device, usable as one of client computing devices 112-118, is described in more detail below with respect to FIG. 2. Briefly, however, client computing devices 112-118 may include virtually any type of computing device capable of receiving and sending a message over a network, such as wireless network 110, or the like. Such devices include portable devices such as, cellular telephones, smart phones, display pagers, radio frequency (RF) devices, music players, digital cameras, infrared (IR) devices, Personal Digital Assistants (PDAs), handheld computers, laptop computers, wearable computers, tablet computers, integrated devices combining one or more of the preceding devices, or the like. Client device 112 may include virtually any computing device that typically connects using a wired communications medium such as personal computers, multiprocessor systems, microprocessor-based or programmable consumer electronics, network PCs, or the like. In one embodiment, one or more of client devices 112-118 may also be configured to operate over a wired and/or a wireless network.

Client devices 112-118 typically range widely in terms of capabilities and features. For example, a cell phone may have a numeric keypad and a few lines of monochrome LCD display on which only text may be displayed. In another example, a web-enabled client device may have a touch sensitive screen, a stylus, and several lines of color LCD display in which both text and graphic may be displayed.

A web-enabled client device may include a browser application that is configured to receive and to send web pages, web-based messages, or the like. The browser application may be configured to receive and display graphic, text, multimedia, or the like, employing virtually any web based language, including a wireless application protocol messages (WAP), or the like. In one embodiment, the browser application may be enabled to employ one or more of Handheld Device Markup Language (HDML), Wireless Markup Language (WML), WMLScript, JavaScript, Standard Generalized Markup Language (SGML), HyperText Markup Language (HTML), eXtensible Markup Language (XML), or the like, to display and send information.

Client computing devices 112-118 also may include at least one other client application that is configured to receive content from another computing device, including, without limit, server computing devices 102-104. The client application may include a capability to provide and receive textual content, multimedia information, or the like. The client application may further provide information that identifies itself, including a type, capability, name, or the like. In one embodiment, client devices 112-118 may uniquely identify themselves through any of a variety of mechanisms, including a phone number, Mobile Identification Number (MIN), an electronic serial number (ESN), mobile device identifier, network address, such as IP (Internet Protocol) address, Media Access Control (MAC) layer identifier, or other identifier. The identifier may be provided in a message, or the like, sent to another computing device.

Client computing devices 112-118 may also be configured to communicate a message, such as through email, Short Message Service (SMS), Multimedia Message Service (MMS), instant messaging (IM), internet relay chat (IRC), Mardam-Bey's IRC (mIRC), Jabber, or the like, to another computing device. However, the present disclosure is not limited to these message protocols, and virtually any other message protocol may be employed.

Client devices 112-118 may further be configured to include a client application that enables the user to log into a user account that may be managed by another computing device. Such user account, for example, may be configured to enable the user to receive emails, send/receive IM messages, SMS messages, access selected web pages, download scripts, applications, or a variety of other content, or perform a variety of other actions over a network. However, managing of messages or otherwise accessing and/or downloading content, may also be performed without logging into the user account. Thus, a user of client devices 112-118 may employ any of a variety of client applications to access content, read web pages, receive/send messages, or the like. In one embodiment, for example, the user may employ a browser or other client application to access a web page hosted by a Web server implemented as server computing device 102. In one embodiment, messages received by client computing devices 112-118 may be saved in non-volatile memory, such as flash and/or PCM, across communication sessions and/or between power cycles of client computing devices 112-118.

Wireless network 110 may be configured to couple client devices 114-118 to network 106. Wireless network 110 may include any of a variety of wireless sub-networks that may further overlay stand-alone ad-hoc networks, and the like, to provide an infrastructure-oriented connection for client devices 114-118. Such sub-networks may include mesh networks, Wireless LAN (WLAN) networks, cellular networks, and the like. Wireless network 110 may further include an autonomous system of terminals, gateways, routers, and the like connected by wireless radio links, and the like. These connectors may be configured to move freely and randomly and organize themselves arbitrarily, such that the topology of wireless network 110 may change rapidly.

Wireless network 110 may further employ a plurality of access technologies including 2nd (2G), 3rd (3G) generation radio access for cellular systems, WLAN, Wireless Router (WR) mesh, and the like. Access technologies such as 2G, 3G, and future access networks may enable wide area coverage for mobile devices, such as client devices 114-118 with various degrees of mobility. For example, wireless network 110 may enable a radio connection through a radio network access such as Global System for Mobil communication (GSM), General Packet Radio Services (GPRS), Enhanced Data GSM Environment (EDGE), WEDGE, Bluetooth, High Speed Downlink Packet Access (HSDPA), Universal Mobile Telecommunications System (UMTS), Wi-Fi, Zigbee, Wideband Code Division Multiple Access (WCDMA), and the like. In essence, wireless network 110 may include virtually any wireless communication mechanism by which information may travel between client devices 102-104 and another computing device, network, and the like.

Network 106 is configured to couple one or more servers depicted in FIG. 1 as server computing devices 102-104 and their respective components with other computing devices, such as client device 112, and through wireless network 110 to client devices 114-118. Network 106 is enabled to employ any form of computer readable media for communicating information from one electronic device to another. Also, network 106 may include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another.

Communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. Furthermore, remote computers and other related electronic devices could be remotely connected to either LANs or WANs via a modem and temporary telephone link. Network 106 may include any communication method by which information may travel between computing devices. Additionally, communication media typically may enable transmission of computer-readable instructions, data structures, program modules, or other types of content, virtually without limit. By way of example, communication media includes wired media such as twisted pair, coaxial cable, fiber optics, wave guides, and other wired media and wireless media such as acoustic, RF, infrared, and other wireless media.

Illustrative Computing Device Configuration

Figure 2:
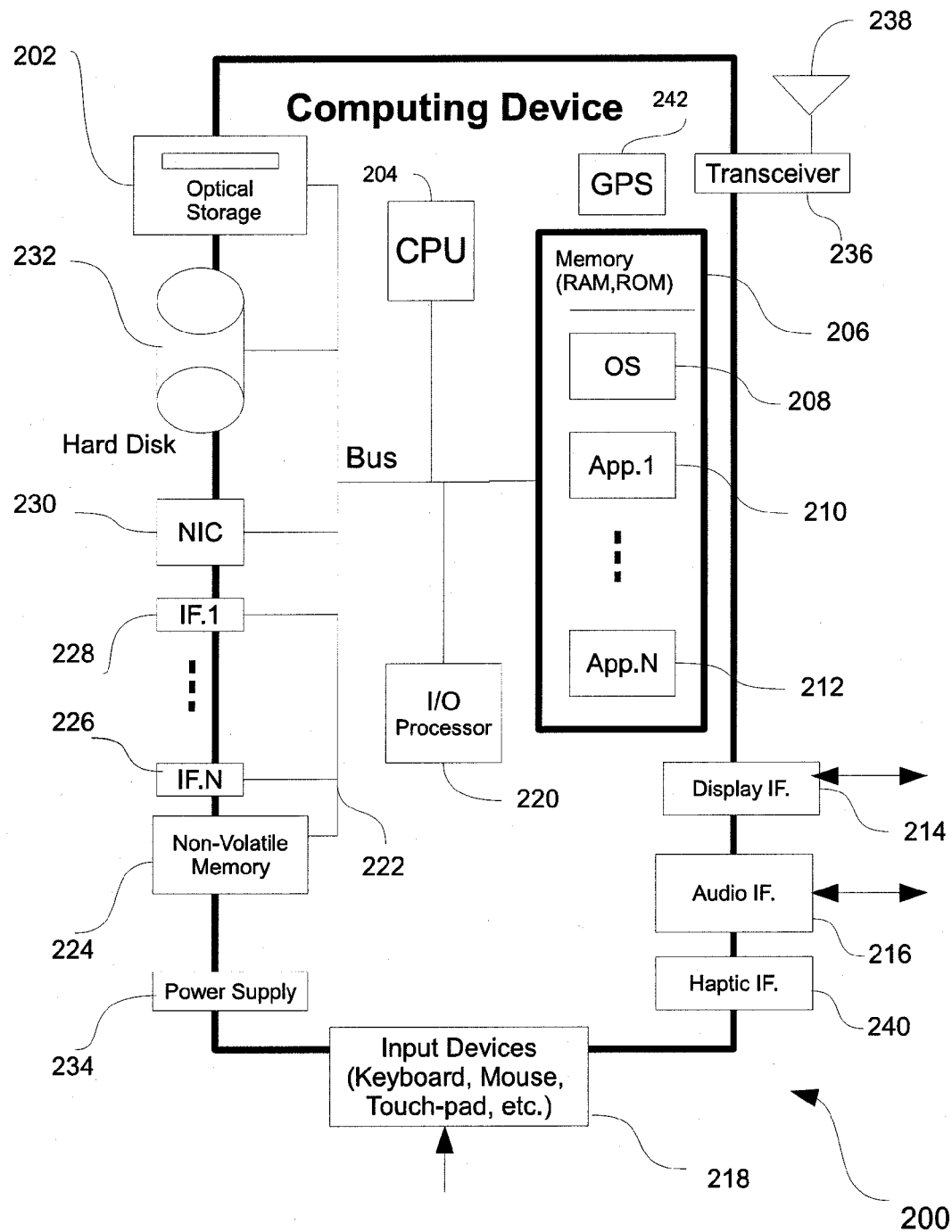
FIG. 2 shows an embodiment of a computing device that may be used in the network computing environment of FIG. 1.

FIG. 2 shows an illustrative computing device 200 that may represent any one of the server and/or client computing devices shown in FIG. 1. The computing device 200 may include less or more than all the components shown in FIG. 2 depending on the functionality needed. For example, a mobile computing device may include the transceiver 236 and antenna 238, while a server computing device 102 of FIG. 1 may not include these components. Those skilled in the art will appreciate that the scope of integration of components of computing device 200 may be different from what is shown. As such, some of the components of computing device 200 shown in FIG. 2 may be integrated together as one unit. For example, NIC 230 and transceiver 236 may be implemented as an integrated unit. Additionally, different functions of a single component may be separated and implemented across several components instead. For example, different functions of I/O processor 220 may be separated into two or more processing units.

With continued reference to FIG. 2, computing device 200 includes optical storage 202, Central Processing Unit (CPU) 204, memory module 206, display interface 214, audio interface 216, input devices 218, Input/Output (I/O) processor 220, bus 222, non-volatile memory 224, various other interfaces 226-228, Network Interface Card (NIC) 320, hard disk 232, power supply 234, transceiver 236, antenna 238, haptic interface 240, and Global Positioning System (GPS) unit 242. Memory module 206 may include software such as Operating System (OS) 208, and a variety of software application programs 210-212. Computing device 200 may also include other components not shown in FIG. 2. For example, computing device 200 may further include an illuminator (for example, a light), graphic interface, and portable storage media such as USB drives. Computing device 200 may also include other processing units, such as a math co-processor, graphics processor/accelerator, and a Digital Signal Processor (DSP).

Optical storage device 202 may include optical drives for using optical media, such as CD (Compact Disc), DVD (Digital Video Disc), and the like. Optical storage devices 202 may provide inexpensive ways for storing information for archival and/or distribution purposes.

Central Processing Unit (CPU) 204 may be the main processor for software program execution in computing device 200. CPU 204 may represent one or more processing units that obtain software instructions from memory module 206 and execute such instructions to carry out computations and/or transfer data between various sources and destinations of data, such as hard disk 232, I/O processor 220, display interface 214, input devices 218, non-volatile memory 224, and the like.

Memory module 206 may include RAM (Random Access Memory), ROM (Read Only Memory), and other storage means, mapped to one addressable memory space. Memory module 206 illustrates one of many types of computer storage media for storage of information such as computer readable instructions, data structures, program modules or other data. Memory module 206 may store a basic input/output system (BIOS) for controlling low-level operation of computing device 200. Memory module 206 may also store OS 208 for controlling the general operation of computing device 200. It will be appreciated that OS 208 may include a general-purpose operating system such as a version of UNIX, or LINUX™, or a specialized client communication operating system such as Windows Mobile™, or the Symbian® operating system. OS 208 may, in turn, include or interface with a Java virtual machine (JVM) module that enables control of hardware components and/or operating system operations via Java application programs.

Memory module 206 may further include one or more distinct areas (by address space and/or other means), which can be utilized by computing device 200 to store, among other things, applications and/or other data. For example, one area of memory module 206 may be set aside and employed to store information that describes various capabilities of computing device 200, a device identifier, and the like. Such identification information may then be provided to another device based on any of a variety of events, including being sent as part of a header during a communication, sent upon request, or the like. One common software application is a browser program that is generally used to send/receive information to/from a web server. In one embodiment, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), and the like, to display and send a message. However, any of a variety of other web based languages may also be employed. In one embodiment, using the browser application, a user may view an article or other content on a web page with one or more highlighted portions as target objects.

Display interface 214 may be coupled with a display unit (not shown), such as liquid crystal display (LCD), gas plasma, light emitting diode (LED), or any other type of display unit that may be used with computing device 200. Display units coupled with display interface 214 may also include a touch sensitive screen arranged to receive input from an object such as a stylus or a digit from a human hand. Display interface 214 may further include interface for other visual status indicators, such Light Emitting Diodes (LED), light arrays, and the like. Display interface 214 may include both hardware and software components. For example, display interface 214 may include a graphic accelerator for rendering graphic-intensive outputs on the display unit. In one embodiment, display interface 214 may include software and/or firmware components that work in conjunction with CPU 204 to render graphic output on the display unit.

Audio interface 216 is arranged to produce and receive audio signals such as the sound of a human voice. For example, audio interface 216 may be coupled to a speaker and microphone (not shown) to enable communication with a human operator, such as spoken commands, and/or generate an audio acknowledgement for some action.

Input devices 218 may include a variety of device types arranged to receive input from a user, such as a keyboard, a keypad, a mouse, a touchpad, a touch-screen (described with respect to display interface 214), a microphone for spoken command input (describe with respect to audio interface 216), and the like.

I/O processor 220 is generally employed to handle transactions and communications with peripheral devices such as mass storage, network, input devices, display, and the like, which couple computing device 200 with the external world. In small, low power computing devices, such as some mobile devices, functions of the I/O processor 220 may be integrated with CPU 204 to reduce hardware cost and complexity. In one embodiment, I/O processor 220 may the primary software interface with all other device and/or hardware interfaces, such as optical storage 202, hard disk 232, interfaces 226-228, display interface 214, audio interface 216, and input devices 218.

An electrical bus 222 internal to computing device 200 may be used to couple various other hardware components, such as CPU 204, memory module 206, I/O processor 220, and the like, to each other for transferring data, instructions, status, and other similar information.

Non-volatile memory 224 may include memory built into computing device 200, or portable storage medium, such as USB drives that may include PCM arrays, flash memory in various configurations and form-factors, pluggable hard drive, and the like. In one embodiment, portable storage medium may behave similarly to a disk drive. In another embodiment, portable storage medium may present an interface different than a disk drive, for example, a read-only interface used for loading/supplying data and/or software.

Various other interfaces 226-228 may include other electrical and/or optical interfaces for connecting to various hardware peripheral devices and networks, such as IEEE 1394 also known as FireWire, Universal Serial Bus (USB), Small Computer Serial Interface (SCSI), parallel printer interface, Universal Synchronous Asynchronous Receiver Transmitter (USART), Video Graphics Array (VGA), Super VGA (SVGA), and the like.

Network Interface Card (NIC) 230 may include circuitry for coupling computing device 200 to one or more networks, and is generally constructed for use with one or more communication protocols and technologies including, but not limited to, Global System for Mobile communication (GSM), code division multiple access (CDMA), time division multiple access (TDMA), user datagram protocol (UDP), transmission control protocol/Internet protocol (TCP/IP), SMS, general packet radio service (GPRS), WAP, ultra wide band (UWB), IEEE 802.16 Worldwide Interoperability for Microwave Access (WiMax), SIP/RTP, Bluetooth, Wi-Fi, Zigbee, UMTS, HSDPA, WCDMA, WEDGE, or any of a variety of other wired and/or wireless communication protocols.

Hard disk 232 is generally used as a mass storage device for computing device 200. In one embodiment, hard disk 232 may be a Ferro-magnetic stack of one or more disks forming a disk drive embedded in or coupled to computing device 200. In another embodiment, hard drive 232 may be implemented as a solid-state device configured to behave as a disk drive, such as a flash-based hard drive. In yet another embodiment, hard drive 232 may be a remote storage accessible over network interface (e.g., network interface card (NIC)) 230 or another interface 226, but acting as a local hard drive. Those skilled in the art will appreciate that other technologies and configurations may be used to present a hard drive interface and functionality to computing device 200 without departing from the spirit of the present disclosure.

Power supply 234 provides power to computing device 200. A rechargeable or non-rechargeable battery may be used to provide power. The power may also be provided by an external power source, such as an AC adapter or a powered docking cradle that supplements and/or recharges a battery.

Transceiver 236 generally represents transmitter/receiver circuits for wired and/or wireless transmission and receipt of electronic data. Transceiver 236 may be a stand-alone module or be integrated with other modules, such as NIC 230. Transceiver 236 may be coupled with one or more antennas for wireless transmission of information.

Antenna 238 is generally used for wireless transmission of information, for example, in conjunction with transceiver 236, NIC 230, and/or GPS 242. Antenna 238 may represent one or more different antennas that may be coupled with different devices and tuned to different carrier frequencies configured to communicate using corresponding protocols and/or networks. Antenna 238 may be of various types, such as omni-directional, dipole, slot, helical, and the like.

Haptic interface 240 is configured to provide tactile feedback to a user of computing device 200. For example, the haptic interface may be employed to vibrate computing device 200, or an input device coupled to computing device 200, such as a game controller, in a particular way when an event occurs, such as hitting an object with a car in a video game.

Global Positioning System (GPS) unit 242 can determine the physical coordinates of computing device 200 on the surface of the Earth, which typically outputs a location as latitude and longitude values. GPS unit 242 can also employ other geo-positioning mechanisms, including, but not limited to, triangulation, assisted GPS (AGPS), E-OTD, CI, SAI, ETA, BSS or the like, to further determine the physical location of computing device 200 on the surface of the Earth. It is understood that under different conditions, GPS unit 242 can determine a physical location within millimeters for computing device 200. In other cases, the determined physical location may be less precise, such as within a meter or significantly greater distances. In one embodiment, however, a mobile device represented by computing device 200 may, through other components, provide other information that may be employed to determine a physical location of the device, including for example, a MAC address, IP address, or the like.

The above-described illustrative operating environment and computing device configuration generally contemplate use of a computing device, which implements a PCM in accordance with this disclosure, in a client/server network communication environment. However, in other embodiments, devices implementing PCM described herein may be used in other network communication environments (e.g., a peer-to-peer network) or even in non-networked environments (e.g., as a non-networked digital camera, music player, etc.).

Figure 3:
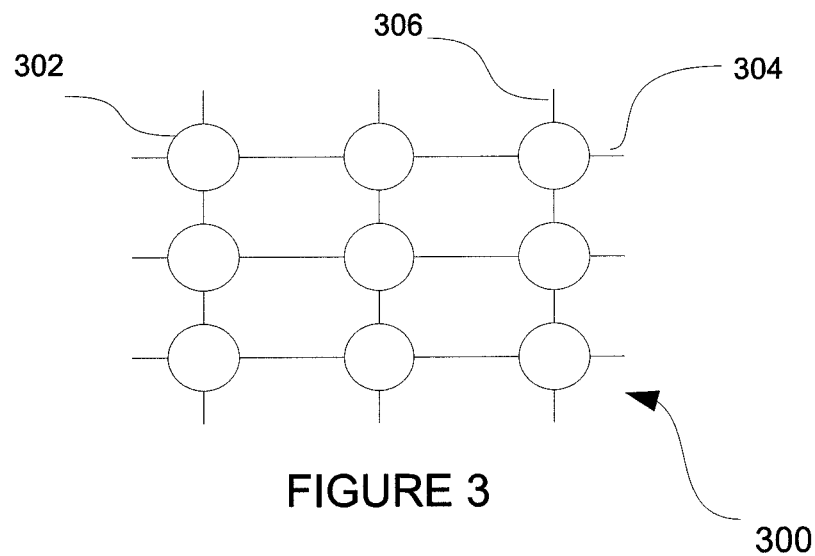
FIG. 3 shows an embodiment of a memory array including a plurality of memory cells.

FIG. 3 shows a memory array 300 of PCM cells. In one embodiment, the memory array 300 includes row address line 304 and column address line 306 used to select one bit of information stored in PCM cell 302. Memory array 300 may be a planar array, a linear array, or an array organized in a different physical arrangement than a two-dimensional (2-D) array. In another embodiment, array 300 may be arranged as a 3-D array each cell 302 of which is addressable by three independent address lines (not shown). In yet another embodiment, array 300 may be an N-dimensional array each storage cell of which is addressed using N distinct address components. For example, in a 4-D array, one address component may identify a memory bank, another may identify a memory segment, while other address components may identify a row and a column. Those skilled in the art will appreciate that many memory array structures are possible without departing from the spirit of the disclosure.

In one embodiment, memory array 300 may be coupled with CPU 204 of FIG. 2 that generates an address to access a particular memory cell within array 300. Memory array 300 may be coupled with CPU 204 indirectly, for example, using a memory controller for generating address data. In one embodiment, memory cell 302 may be PCM cell, as more fully described with respect to FIG. 4 below.

Figure 4:
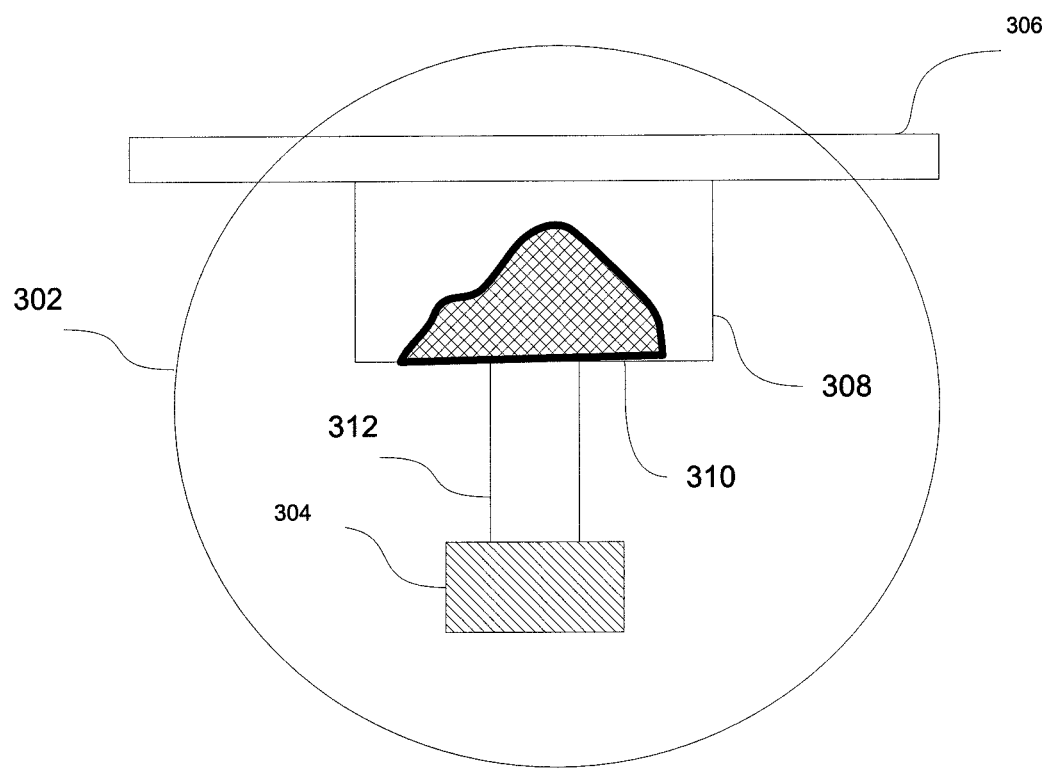
FIG. 4 shows an embodiment of a memory Phase-Change Memory cell.

FIG. 4 shows PCM cell 302 that may be used as a storage element in array 300 of FIG. 3. In one embodiment, the structure of multi-phase PCM cell 302 includes a row electrode implemented, for example, by row address line 304, and a column electrode implemented, for example by column address line 306. PCM cell 308 may be constructed from a multi-phase material that has distinct states, each state having distinct optical, electrical, or other measurable physical properties and/or characteristics. For example, a material may be transformed from one state to another state, using an electrical current, voltage, temperature, or other physical stimulation, to effect a molecular and/or phase change in the cell material. One such PCM cell material is chalcogenide glass, the molecular structure of which may be reversibly altered by heat. Chalocogenide glass, when changed into certain alloys, such as Germanium, antimony (chemical symbol: Sb), and Tellurium (GST) alloy, changes between a crystalline state and an amorphous state, when heated according to certain thresholds, more fully described below with respect to FIG. 5.

In each material phase, such as the crystalline and amorphous phases, the electrical and/or optical properties of the PCM cell material is different. For example, in the crystalline phase, light and current transmission through the PCM cell material exceed those through the amorphous phase of the material. That is, in crystalline phase, the PCM cell material is more transparent resulting in higher light transmission, and also has lower electrical resistance resulting in higher electrical current transmission. The differential optical characteristics between the crystalline and the amorphous phases may be used, for example, in optical media such as CD and DVD, to store information and reliably read the stored information later. Similarly, the differential electrical characteristics, such as electrical resistance and corresponding current and/or voltage, may be used in PCM cells to store bits of information for later electronic retrieval.

In another embodiment, one or more partially crystalline states may be obtained by carefully controlling the temperature of the PCM cell material. With two additional states of partial crystallization between the amorphous state and the crystalline state, a single PCM cell having four states may be used, in effect, to represent two bits of binary (2-state) data, thus doubling memory capacity. In another embodiment, memory capacity may be increased by using tri-nary (number base 3), or generally, N-nary (number base N) representation of numbers (as opposed to binary). Such number representations, that use a number base different from two (2), which is used in binary representation, may be converted from and to the cell by additional interface circuitry at PCM cell interface and/or at PCM array interface level to maintain compatibility with binary computing systems.

In operation, data may be written to and/or read from a PCM cell, during write and read operations, respectively, using appropriate electrical currents, current thresholds, and temperature thresholds, as further described below with respect to FIG. 5.

During the write operation, if the amorphous phase is used to represent logic-0, for example, a binary 0 (representing data) may be written to a PCM cell by heating the cell material using a first write current, $I_{res}$, to place the material in the amorphous phase (Reset state). Similarly, if the crystalline phase is used to represent logic-1, for example, a binary 1 (representing data) may be written to the PCM cell by heating the cell material, using a second write current, $I_{set}$, to place the material in the crystalline phase (Set state). During the read operation, to read the data stored in the PCM cell, an actual read current, $I_{cell}$, passed through the PCM cell may be measured. If the $I_{cell}$ value is large relative to current flow expected in the high-resistance amorphous phase, then $I_{cell}$ may be interpreted as representing a binary 1. That is, the cell is determined to be in the low-resistance crystalline state. Similarly, an $I_{cell}$ value that is substantially smaller relative to current flow expected in the low-resistance crystalline phase may be interpreted as a binary 0. That is, the cell is determined to be in the high-resistance amorphous state.

Those of ordinary skill in the art will appreciate that current, voltage, and resistance are closely related by the Ohm's law (Voltage=Resistance×Current), and knowing any two of these variables, the third one may be determined. As such, in one embodiment, PCM cell read current may be determined by measuring corresponding voltage values, instead of measuring currents directly. In another embodiment, the resistance of the PCM cell may be determined/measured directly via other physical properties of the cell body material, thus determining the corresponding material state and data stored therein. For example, opacity of the cell material may be used to determine material state and corresponding logic value. In yet another embodiment, a magnetic field of the read current may be sensed and used to determine read current magnitude and thus, cell data value.

More specifically, in one embodiment, the actual read current $I_{cell}$ may be compared with one or more thresholds to determine whether the stored information represents a binary 1 or a binary 0. In one embodiment, if the read current is greater than a logic-1 current threshold, $I_{v1}$, the corresponding PCM cell may be deemed to be in the crystalline (Set) state. If the read current is smaller than a logic-0 current threshold, $I_{v0}$, then the corresponding PCM cell may be deemed to be in the amorphous (Reset) state.

In an embodiment where a PCM cell has more than two states, for example, two semi-crystalline states in addition to the crystalline and amorphous states, an additional read current threshold, $I_{intermediate-i}$, for each additional state-i, may be used to determine the state in which the PCM cell is currently settled during a cell read operation. More specifically, in a cell with four states, four different electrical resistances exist that increase from the complete crystalline state to the complete amorphous state. Each state corresponds to a predetermined read current threshold (for example, $I_{intermediate-i}$) at which $I_{cell}$ is either below or above that threshold. During a read operation, to determine if a present state of the PCM cell corresponds to a particular intermediate state, the read current $I_{cell}$ may be compared with the two thresholds separating the intermediate state from the other two states surrounding the intermediate state.

As noted above, the first write current, $I_{res}$, may be used to heat and place the cell body in amorphous phase, while the second write current, $I_{set}$, may be used to place the cell body in crystalline phase. In the embodiment where GST or another suitable chalcogenide glass alloy is used as the PCM cell body material, the Reset write current is generally larger than the Set write current. For example, the Reset pulse may be a current pulse in the range of 200-450 Micro-Amperes (MA), while the Set pulse may be a current pulse in the range of 130-360 MA.

Heater 312 may be used during the write operation to heat PCM cell 308 material to effect phase change in the material. In one embodiment, heater 312 may be a resistor that generates heat when an electrical current is passed through the resistor. When such generated heat crosses a certain threshold, such as a melting point of the PCM cell material, PCM cell 308 material undergoes a material phase change and settles into an amorphous mass 310 in proximity of heater 312 if rapidly cooled by removing the electrical current. This may be referred to as "quench" operation. In another embodiment, induction heat may be generated by alternating magnetic fields around an inductor in proximity of the cell material. Eddy currents induced in the cell material by the alternating magnetic field may generate the heat necessary to effect phase change in PCM cell body.

Figure 5:
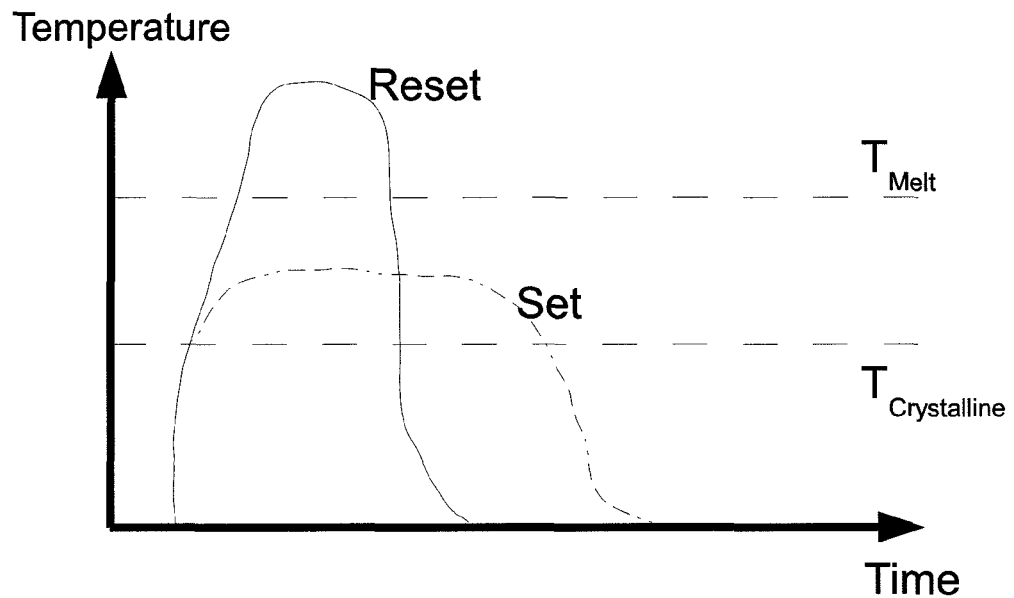
FIG. 5 shows a graph depicting illustrative Reset and Set temperature curves.

FIG. 5 shows a graph depicting illustrative Reset and Set temperature curves. Generally, a PCM cell may be placed in the amorphous state, commonly associated with the Reset state, if the Reset write current, $I_{res}$, generates enough heat, via a heater, such that a melting temperature, $T_{melt}$, of the PCM cell material is exceeded and material is rapidly cooled by removing the programming current (this way, atoms do not have enough time to crystallize, which could happen with lower temperatures and longer times). Similarly, the PCM cell may be placed in the crystalline state, commonly associated with the Set state, if the Set pulse, $I_{set}$, generates enough heat for enough time, via a heater, such that a crystalline temperature, $T_{crystalline}$, of the PCM cell material is exceeded, and $T_{melt}$ is not exceeded. The Reset temperature curve, shown in FIG. 5, is of shorter relative duration than the Set temperature curve, shown as a dotted curve. This is because to settle in the crystalline state, the molecules of the cell material need enough time to form crystal lattices. In contrast, to settle in the amorphous state, the cell material needs to be cooled relatively rapidly to preclude the molecules from forming crystalline lattices by not giving the molecules sufficient time for crystallization during the crystallization temperature interval $T_{melt}$-$T_{crystalline}$. As such, the Reset pulse and corresponding temperature curve generated by the Reset pulse are relatively short in duration and have the form of a current pulse and temperature pulse, respectively. In contrast, the Set pulse and corresponding temperature curve are relatively long in duration, compared with the Reset pulse and temperature, and have the form of a gradual down-sloping curve.

In the embodiment where the PCM cell has more than two states, for example, two semi-crystalline states in addition to the crystalline and amorphous states, an additional write current $I_{write\_interm\_j}$, may be used to place the cell in a corresponding intermediate state-i. The write current may be applied in a manner similar to the one described below with respect to FIG. 6.

Figure 6:
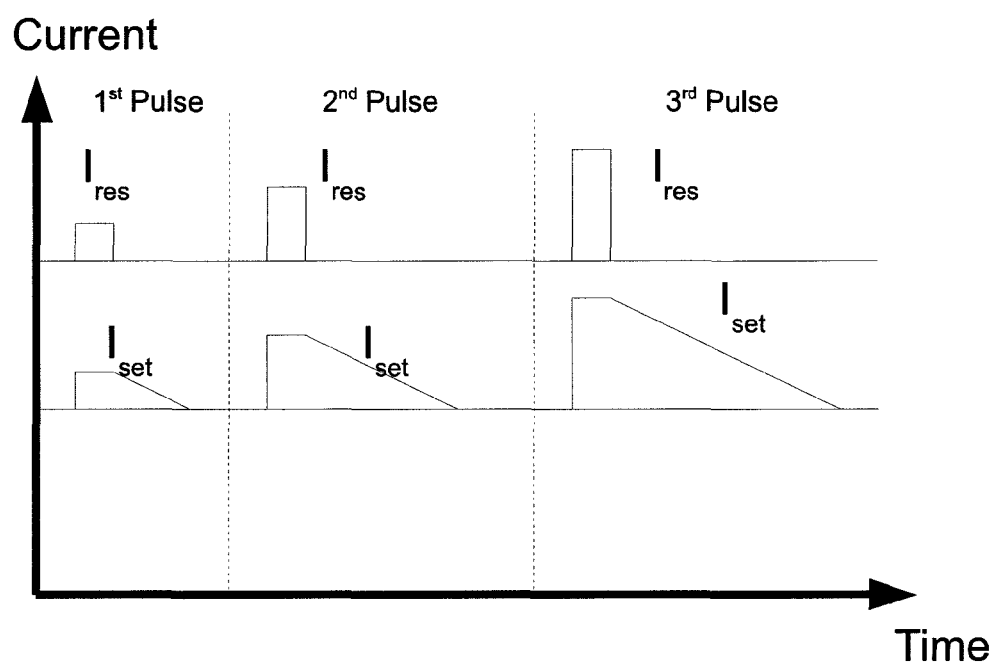
FIG. 6 shows a graph depicting illustrative Reset and Set pulse pulses.

FIG. 6 shows a graph depicting illustrative Reset and Set pulses. As noted above with respect to FIG. 5, $I_{res}$ has the form of a short-duration pulse while $I_{set}$ has the form of a long-duration curve. These write currents may generally be applied to generate heat as a sequence of pulses and/or curves with increasing amplitude and increasing duration to generate heat. For example, in one embodiment, $I_{res}$ may be applied to heater 312 of FIG. 4 as a sequence of pulses with increasing amplitudes until the temperature of the PCM cell material rises above $T_{melt}$ and the amorphous state is realized. Similarly, $I_{set}$ may be applied to heater 312 with increasing amplitude and duration until the temperature of PCM cell material rises to a point between $T_{crystalline}$ and $T_{melt}$. A suitable duration for $I_{set}$ and the corresponding temperature allows proper crystallization of the PCM cell material.

How well and thoroughly the PCM cell material crystallizes affects the degree to which electrical resistance of the PCM cell is decreased. The better the cell is crystallized, the lower the electrical resistance of the cell and the higher the corresponding read current through the cell will be. Conventionally, a Program and Verify (P & V) algorithm may be used to effect a Set state in a PCM cell. In P & V, a "programming" current, for example, $I_{set}$ is applied and then a read current is used to verify the Set state by comparing the read cell value (for example, $I_{cell}$) with a read Set threshold, for example, $I_{v1}$. If $I_{cell}$ is less than $I_{v1}$, $I_{set}$ is increased in amplitude and duration relative to a previous $I_{set}$ curve. This process is repeated until $I_{cell}$ exceeds $I_{v1}$. The P & V algorithm may be similarly applied to $I_{res}$, where $I_{res}$ is increased iteratively until the read current is verified to be less than the read Reset threshold, $I_{v0}$.

In a conventional P & V process, the Set and Reset states for a given cell are generally entered and exited independently of each other and of other cells in a PCM array. $I_{v1}$ threshold is chosen such that the Set state of all cells in a PCM array may be verified using this threshold. Therefore $I_{v1}$ should be chosen to be the lowest threshold of all cells that represent a Set state, because the $I_{cell}$ of all Set cells must be greater than $I_{v1}$ to qualify for a valid read. However, the lower the value of $I_{v1}$, the smaller will be the gap between the thresholds of a Set state and a Reset state and the more will be the chance of a read-error. Conversely, if each of the memory cells in the PCM array is well crystallized, then $I_{v1}$ for the PCM array can be selected at a higher value, further separating $I_{v1}$ and $I_{v0}$ thresholds from each other, and in turn, better distinguishing the corresponding Set and Reset states from each other.

In one embodiment, $I_{v1}$ may be selected to be about 15 MA. The read current, $I_{cell}$, of different cells in a PCM array may vary across a relatively large range of values because of the cell-specific characteristics indicated above. For example, $I_{cell}$ may vary about 15 MA-30 MA in a given technology node. Because of this large variation in the read current, selection of a large $I_{v1}$ threshold may cause read error in some cells the read current of which falls below such large $I_{v1}$ threshold. The variation of the read current of a particular cell may be further aggravated by a poor crystallization. For reliably reading the Set state (for example, representing logic-1 or binary 1 data), it may be advantageous to effect a more complete crystallization (Set) state in the particular cell, reducing its electrical resistance, and increasing $I_{cell}$ that more easily exceeds $I_{v1}$. Thus, a more complete crystallization may provide lower read error rates compared with a less complete crystallization.

A more complete crystallization may be achieved by linking the Set and the Reset pulses together to increase Set efficiency. Set efficiency and crystallization completeness are increased if the Set programming current is such that the resulting temperature is close to $T_{melt}$. A constant K may be determined such that K multiples of $I_{res}$ (resulting from the prior Reset state) may result in a temperature close to $T_{melt}$ ($K \times I_{res} \rightarrow T_{melt}$). A down-sweep of $I_{set}$, continuously reducing $I_{set}$ from a high value to a lower value, may start from $I_{set}$ corresponding to the $T_{melt}$ threshold. In one embodiment K may be a value between approximately 0.8 and 1.1.

In an embodiment where the PCM cell has more than two states, for example, two semi-crystalline states in addition to the crystalline and amorphous states, an additional constant Ki for each additional state-i may be used to optimally place the cell material in the respective state-i. Ki, is generally selected to be different from K discussed above to correspond to a temperature level that is sub-optimal for crystallization. In this embodiment, Ki may be multiplied by $I_{res}$ (resulting from the Reset state before the present Set state being established) to provide a starting high current for Set sweep down that may eventually result in a partial crystallization state. The partial crystallization state forms an intermediate state distinct from the amorphous and crystalline states. In another embodiment, constant K may be used to start a Set sweep down and determine the actual state of the cell by periodically comparing $I_{cell}$ with the read threshold $I_{intermediate\_i}$. To place the cell in a target intermediate state, the process may be stopped once $I_{cell}$ is determined to be in a desired range between two adjacent read thresholds.

Figure 7A:
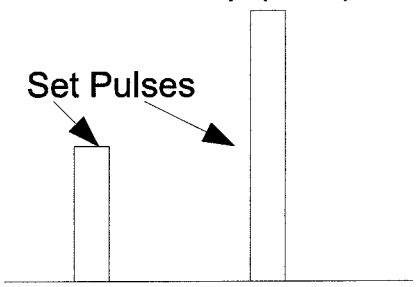
FIG. 7A shows a diagram of illustrative Set Stair-Case-Up (SCU) current pulses.
Figure 7B:
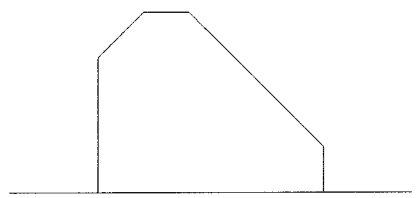
FIG. 7B shows a diagram of an illustrative blind Set sweep.

FIG. 7A shows a diagram of illustrative Set Stair-Case-Up (SCU) current pulses. In one embodiment, to prepare the cell for the process of writing data, an initial non-optimal Set state may be established, to place the memory cell in a known state, before writing data to the cell. In one embodiment, the initial non-optimal Set state may be established using a write current, for example, $I_{set}$, that may be changed according to a stair-case sequence, where the amplitude of the write current pulse is increased successively to a desired value. FIG. 7B shows a diagram of an illustrative blind Set sweep. In Set sweep, $I_{set}$ is continuously decreased from a high value down to an appropriate value needed for crystallization. Blind Set sweep is not dependent on a previous Reset state. In one embodiment, Set sweep may start from a predetermined high value and be decreased. $I_{set}$ may first be increased to the predetermined high value using the SCU method.

The predetermined high value for $I_{set}$ is generally not likely to be optimal for achieving a high degree of crystallization. As such, the high value for Set sweep down may be determined dynamically based on a value of an immediate prior Reset pulse, $I_{res}$, for example, by multiplying a maximum value of $I_{res}$ with K.

Figure 8:
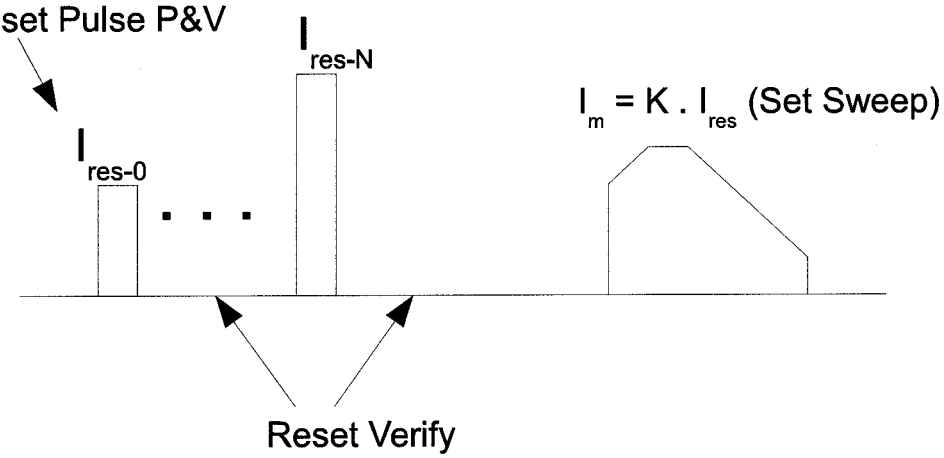
FIG. 8 shows a diagram of an illustrative Reset pulse Program and Verify (P&V) operation before a Set sweep operation.

FIG. 8 shows a diagram of an illustrative Reset pulse Program and Verify operation before a Set sweep operation. In one embodiment, a Set state is effected by first effecting a Reset state and then using $I_{res}$ resulting from the Reset state to effect the Set state. The Reset state may be achieved using the P & V process to successively increase from a low value $I_{res-0}$ to a highest value $I_{res-N}$. At each step, a current pulse $I_{res-i}$, where $0<i<N$, is applied and then the Reset state is verified by comparing $I_{cell}$ with $I_{v0}$. This process may be continued until $I_{cell}<I_0$. At this point, $I_{res-N}$ is multiplied by K to obtain the high value for $I_{set}$ sweep down. $I_{set}$ is swept down until $I_{cell}>I_{v1}$. This process links $I_{set}$ to $I_{res}$ such that the high value of $I_{set}$ may be equal to $K \times I_{res-N}$, which in turn corresponds to a temperature close to $T_{melt}$. As noted above, starting $I_{set}$ sweep down from a current value approximately corresponding to $T_{melt}$ generally results in a relatively complete crystallization which may be needed for reliable reading of PCM cell data represented by Set state.

Generally, $I_{v0}$ levels and variations are significantly less than $I_{V1}$. For example, in one embodiment, $I_{v0}$ may be on the order of 2 MA with corresponding variations between 0-2 MA, while $I_{v1}$ may be on the order of about 15 MA with larger variations. Accordingly, using $I_{v0}$ as the basis for finding the high current level for Set sweep down, may result in significantly more accurate determination of Set pulses used to place the PCM cell in the Set state.

Figure 9:
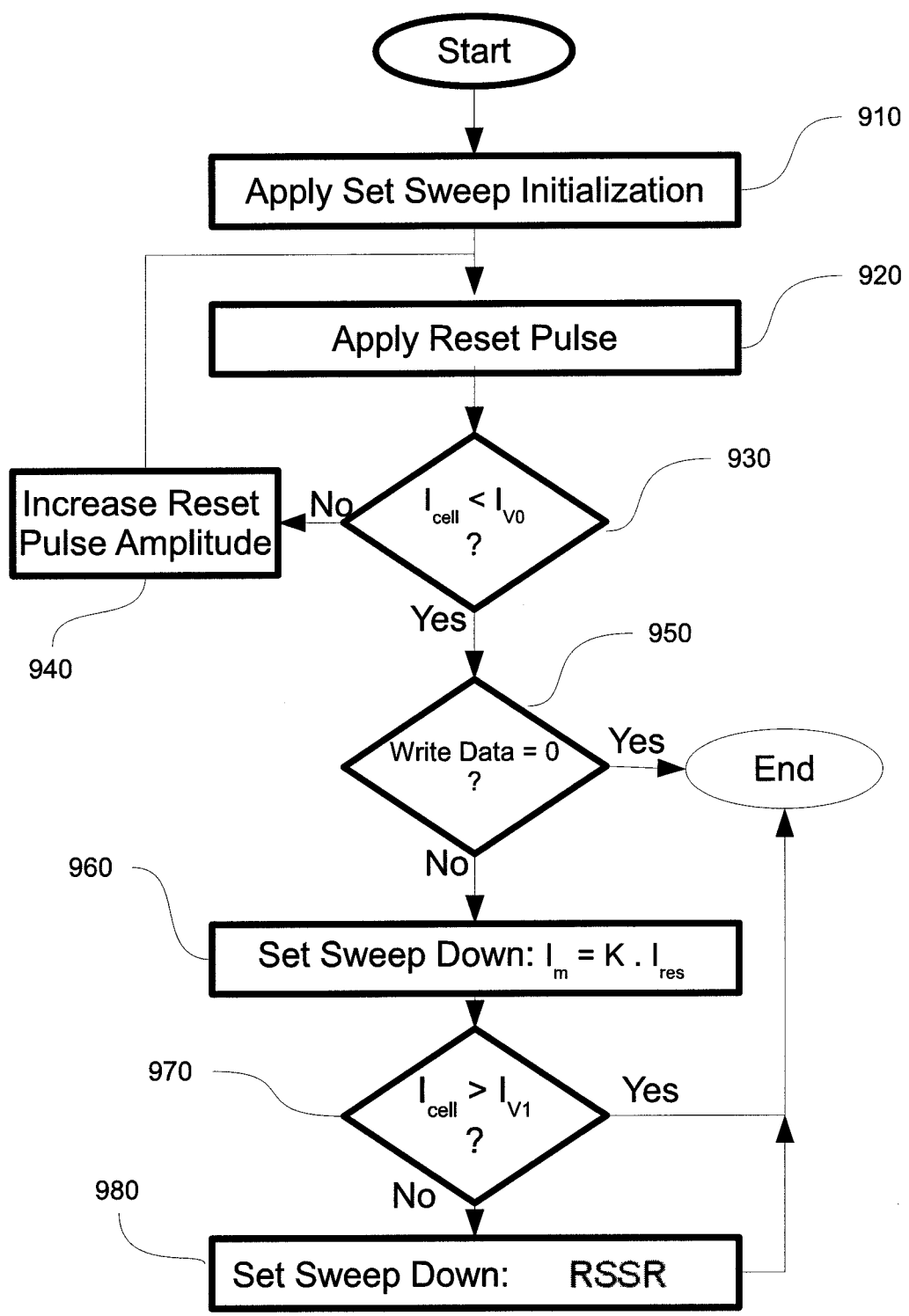
FIG. 9 shows an illustrative process of writing a logic-1 to a PCM cell.

FIG. 9 shows an illustrative process of writing a logic-1 to a PCM cell. The process proceeds to block 910 where an initial Set sweep is applied to the cell. In some embodiments, the initial Set sweep may be just applied to the cell that is to be set and not, e.g., to those cells that are to be reset. In one embodiment, the initial Set sweep may be performed based on a conventional P & V process for Set operation that places the PCM cell in a Set state. In another embodiment, a blind Set sweep down may be performed, as described with respect to FIG. 7B. An SCU process may also be used in conjunction with the blind Set sweep, as described with respect to FIG. 7A, to start from a high Set pulse and sweep down. The process moves on to block 920.

At block 920, once a Set state is achieved in the PCM cell, a Reset pulse may be applied to start placing the cell in the Reset state. For example, the P & V process may be applied to Reset pulses, as described with respect to FIG. 8.

At block 930, the read current $I_{cell}$ may be compared with read current threshold $I_{v0}$ for the Reset state. If $I_{cell}<I_{v0}$, the Reset state is deemed established and the process moves on to block 950. Otherwise, the amplitude of the write Reset pulse $I_{res}$ is increased in block 940 and the process returns to block 920 to continue with the P & V process.

At block 950, it is ascertained whether the data to be written to the PCM cell is binary 0 or binary 1. If the data is binary 0, then the process terminates. Otherwise, the process continues to block 960.

At block 960, the high value of write Set pulse $I_{set}$ is determined based on the value of $I_{res}$. In one embodiment, $I_{set}$ is assigned a value equal to a constant K multiplied by a high value of $I_{res}$. In another embodiment, $I_{set}$ may be determined based on a different mathematical function of $I_{res}$. For example, $I_{set}$ may be assigned $[I_{res}+C1]$, where C1 is a predetermined constant. In another embodiment, $I_{res}$ is used in a sweep-down process to effect crystallization of the PCM cell.

At block 970, the read current $I_{cell}$ may be compared with read current threshold $I_{v1}$ for the Set state. If $I_{cell}>I_{v1}$, the Set state is deemed established and the process terminates. Otherwise, at block 980, a recovery set sweep ramp (RSSR) is used in a Set sweep down process to ensure that the Set pulse $I_{set}$ can place the PCM cell in the Set state. The RSSR starts from a high enough pulse value that has a high likelihood of adequate crystallization.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks. The computer program instructions may also cause at least some of the operational steps shown in the blocks of the flowchart to be performed in parallel. Moreover, some of the steps may also be performed across more than one processor, such as might arise in a multiprocessor computer system. In addition, one or more blocks or combinations of blocks in the flowchart illustration may also be performed concurrently with other blocks or combinations of blocks, or even in a different sequence than illustrated without departing from the scope or spirit of the invention.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems, including solutions embedded in the same memory chip or memory package, which perform the specified actions or steps, or combinations of special purpose hardware and computer instructions.

Changes can be made to the invention in light of the above Detailed Description. While the above description details certain embodiments of the invention and describes the best mode contemplated, no matter how detailed the above appears in text, the invention can be practiced in many ways. Details of the system may vary considerably in its implementation details, while still being encompassed by the invention disclosed herein.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above specification, examples, and data provide a complete description of the manufacture and use of the composition of the invention. Since many embodiments of the invention can be made without departing from the spirit and scope of the invention, the invention resides in the claims hereinafter appended.

The invention claimed is:

1. A phase change memory (PCM) device comprising:
a phase change data storage cell;
a heating component configured to heat the storage cell; and
a memory interface configured to apply at least one of a write Reset pulse or a write Set pulse to the heating component, wherein:
the write Reset pulse is configured to place the data storage cell in a Reset state; and
the write Set pulse is configured to place the data storage cell in a Set state, the write Set pulse comprising:
a high value pulse portion, the high value pulse portion determined based on the write Reset pulse for the data storage cell; and
a down sweep pulse portion, the down sweep pulse portion continually decreasing from the high value pulse portion and applied at least until the data storage cell is in the Set state.

2. The PCM device of claim 1, wherein the down sweep pulse portion is applied until a read current of the data storage cell is above a read current threshold.

3. The PCM device of claim 2 wherein a time duration of the down sweep pulse portion is at least a predetermined time duration determined to provide a read current of the data storage cell above the read current threshold.

4. The PCM device of claim 2, wherein the read current of the data storage cell is periodically compared to the read current threshold to determine when the read current of the data storage cell is above the read current threshold.

5. The PCM device of claim 1, wherein the phase change data storage cell is a multi-phase data storage cell, the multi-phase data storage cell further comprising an intermediate state, and wherein the memory interface is configured to apply the down sweep pulse portion until the data storage cell is in the intermediate state.

6. The PCM device claim 5, wherein a read current of the data storage cell is periodically compared to a read current threshold for the intermediate state to determine when a read current of the data storage cell is above the read current threshold for the intermediate state.

7. The PCM device of claim 1, wherein the high value pulse portion of the write Set pulse is equal to a predetermined proportion of the write Reset pulse.

8. The PCM device of claim 1, further comprising a plurality of the phase change data storage cells, wherein each of the plurality of the data storage cells has a particular write Set pulse determined based on a particular Reset pulse used to place that particular data storage cell in the Reset state, and wherein the Reset and Set pulses for each corresponding particular data storage cell are determined independently of Reset and Set pulses for other data storage cells.

9. A method of writing data to a phase change memory (PCM) device, the method comprising:
applying a write Reset pulse to place a data storage cell of the PCM device in a Reset state; and
applying a write Set pulse to place the data storage cell in a Set state, the write Set pulse comprising:
a high value pulse portion, the high value pulse portion determined based on the write Reset pulse; and
a down sweep pulse portion, the down sweep pulse portion continually decreasing from the high value pulse portion and applied at least until the data storage cell is in the Set state.

10. The method of claim 9, wherein the down sweep pulse portion is applied until a read current of the data storage cell is above a read current threshold.

11. The method of claim 10, wherein the read current of the data storage cell is periodically compared to the read current threshold to determine when the read current of the data storage cell is above the read current threshold.

12. The method of claim 10, wherein a time duration of the down sweep pulse portion is at least a predetermined time duration for the data storage cell to have a read current above the read current threshold.

13. The method of claim 9, further comprising placing the data storage cell of the PCM device in an intermediate state, wherein the down sweep pulse portion is applied until the data storage cell is in the intermediate state.

14. The method claim 13, wherein a read current of the data storage cell is periodically compared to a read current threshold for the intermediate state to determine when the read current of the data storage cell is above the read current threshold for the intermediate state.

15. The method of claim 9, wherein the write Set pulse is equal to a predetermined proportion of the write Reset pulse.

16. The method of claim 9, further comprising:
applying write Reset pulses to place a plurality of data storage cells of the PCM device in the Reset state; and
applying write Set pulses to place the plurality of data storage cells of the PCM device in the Set state,
wherein each of the plurality of the data storage cells has a particular write Set pulse determined based on a particular Reset pulse used to place that particular data storage cell in the Reset state, and wherein the Reset and Set pulses for each corresponding particular data storage cell are determined independently of Reset and Set pulses for other data storage cells.

17. A memory array comprising:
a plurality of phase change data storage cells; and
a plurality of heating components configured to heat the plurality of data storage cells by receiving at least one of a write Reset pulse or a write Set pulse, wherein:

the write Reset pulse is configured to place a data storage cell in a Reset state; and the write Set pulse is configured to place the data storage cell in a Set state, the write Set pulse comprising:

a first high value pulse portion, the first high value pulse portion equal to a first predetermined proportion of the write Reset pulse; and a first down sweep pulse portion, the first down sweep pulse portion continually decreasing from the first high value pulse portion and applied at least until the data storage cell is in the Set state.

18. The memory array of claim 17, wherein the data storage cell further comprises an intermediate state.

19. The memory array of claim 18, wherein the heating components are further configured to heat the data storage cells by receiving a write intermediate pulse, the write intermediate pulse configured to place the data storage cell in the intermediate state, the write intermediate pulse comprising:

a second high value pulse portion, the second high value pulse portion equal to a second predetermined proportion of the write Reset pulse; and a second down sweep pulse portion, wherein the first predetermined proportion of the write Reset pulse for placing the data storage cell in the Set state is larger than the second predetermined proportion of the write Reset pulse for placing data storage cell in the intermediate state.

20. The memory array of claim 19, wherein a time duration of the first down sweep pulse portion is longer than a time duration of the second down sweep pulse portion.

* * * * *